United States Patent
Chou et al.

(10) Patent No.: US 9,897,648 B2
(45) Date of Patent: Feb. 20, 2018

(54) ON-CHIP BUILT-IN TEST AND OPERATIONAL QUALIFICATION

(71) Applicant: COSEMI TECHNOLOGIES, INC., Irvine, CA (US)

(72) Inventors: Wu-Chun Chou, Chandler, AZ (US); Michael Eugene Davis, Phoenix, AZ (US); Charles Phillip McClay, Fountain Hills, AZ (US)

(73) Assignee: Cosemi Technologies, Inc., Irvine, CA (US)

( * ) Notice: Subject to any disclaimer, the term of this patent is extended or adjusted under 35 U.S.C. 154(b) by 0 days.

(21) Appl. No.: 14/814,066

(22) Filed: Jul. 30, 2015

(65) Prior Publication Data

US 2016/0291086 A1 Oct. 6, 2016

Related U.S. Application Data

(60) Provisional application No. 62/142,608, filed on Apr. 3, 2015.

(51) Int. Cl.
*G01R 31/3187* (2006.01)
*G01R 31/28* (2006.01)
*G01R 31/26* (2014.01)

(52) U.S. Cl.
CPC ..... *G01R 31/2884* (2013.01); *G01R 31/2635* (2013.01); *G01R 31/28* (2013.01); *G01R 31/2896* (2013.01); *G01R 31/3187* (2013.01)

(58) Field of Classification Search
CPC .............. G01R 31/27; G01R 19/0061; G01R 19/0092; G01R 1/203; G01R 31/025; G01R 31/2648; G01R 31/3167; G01R 31/318544; G01R 31/31703; G01R 31/31713; G01R 31/31924; G01R 31/2635; G01R 31/28; H01L 31/102; H01L 31/105; G06F 19/00; G06F 13/385; G06F 3/0304; G09G 3/32; G09G 3/3266; G09G 2330/028; G09G 3/3696; G01N 21/3577; G01N 2201/062; H05B 33/0896; H03F 2200/91; H03F 3/387; H03H 11/30; H03H 11/1217; H03H 11/1252; H03H 11/36; H03H 7/48

See application file for complete search history.

(56) References Cited

U.S. PATENT DOCUMENTS

| 5,063,307 | A | * | 11/1991 | Zommer | ............. H01L 27/0248 |
|---|---|---|---|---|---|
| | | | | | 257/467 |
| 6,272,160 | B1 | * | 8/2001 | Stronczer | ............. H01S 5/0427 |
| | | | | | 372/38.02 |
| 6,624,405 | B1 | | 9/2003 | Lau et al. | |
| 6,675,322 | B1 | | 1/2004 | Schaffroth et al. | |
| 7,440,865 | B1 | | 10/2008 | Hofmeister et al. | |

(Continued)

OTHER PUBLICATIONS

Partial International Search Report for International Patent Application No. PCT/US2016/025521, dated Jul. 22, 2016 (counterpart of U.S. Appl. No. 14/814,066).

*Primary Examiner* — Vinh Nguyen
(74) *Attorney, Agent, or Firm* — Loza & Loza, LLP; George Fountain

(57) ABSTRACT

Operational and functional testing of the optical Physical Media Dependent Integrated Circuits ("PMD ICs") is achieved by constructing a switchable on-chip load with similar or equivalent electrical characteristics of a targeted photonic device.

5 Claims, 7 Drawing Sheets

(56) References Cited

U.S. PATENT DOCUMENTS

| | | | |
|---|---|---|---|
| 2007/0167723 A1* | 7/2007 | Park | B82Y 30/00 600/409 |
| 2010/0207791 A1* | 8/2010 | Ohnhaeuser | H03M 1/0612 341/118 |
| 2010/0232205 A1* | 9/2010 | Parkinson | G11C 11/56 365/148 |
| 2011/0270543 A1 | 11/2011 | Schmidt et al. | |

* cited by examiner

US 9,897,648 B2

ON-CHIP BUILT-IN TEST AND OPERATIONAL QUALIFICATION

CROSS REFERENCE TO RELATED APPLICATIONS

This application claims the benefit of U.S. Provisional Application No. 62/142,608, filed Apr. 3, 2015, the entire disclosure of which is incorporated herein by reference.

FIELD OF INVENTION

The subject matter herein generally relates to analog circuits and signals and associated amplification techniques. In particular, the invention relates to an on-chip built-in test and operational qualification system and method.

BACKGROUND OF INVENTION

Optical physical media dependent ("PMD") integrated circuits ("ICs") ("PMD ICs") are designed to operate in conjunction with photonic devices such as lasers and photodiodes/photo-detectors. These circuits are the interface between electrical and optical domains. During functional and/or qualification testing, e.g., high-temperature operational life ("HTOL"), it is desirable for the PMD ICs to be dynamically operating and realistically loaded. As the operation data rate increases, such loading conditions become either cost-prohibitive or unattainably complex. Many existing approaches trade off test relevance with less than ideal load conditions and/or suffer from wider variation range in results due to test system complexity.

SUMMARY OF INVENTION

According to one embodiment, described is an on-chip built-in test and qualification system comprising a driver device for driving a device, wherein the device is associated with a current characteristic and a voltage characteristics, a load circuit designed to exhibit the current-voltage ("I-V") characteristic of the device and a switch coupled between the driver device and the load circuit, such that the switch allows selection of one of either the driver device driving the device or the load circuit, wherein the switch may be activated during operational qualification of the driver device.

According to one embodiment, described is a method for testing an operation of a driver device in driving a load in a manufacturing environment comprising determining an I-V characteristic of the device, introducing an on-chip load to reproduce the I-V characteristic of the device, and switchably coupling the on-chip load to the driver circuit to enable a selection of one of either the driver device driving the device or the load circuit.

According to one embodiment, described is an on-chip built-in test and qualification system comprising a first channel and a second channel, wherein each channel comprises a first pad and a second pad, a switched resistor network coupling said first pad and said second pad, wherein the switched resistor network allows for selection of a desired resistance between the first pad and the second pad, an on-chip load coupled to the first pad, and an amplifier coupled to the second pad.

DETAILED DESCRIPTION

According to one embodiment, operational and functional testing of the PMD ICs is achieved by constructing a switchable on-chip circuit with similar or equivalent electrical characteristics of a targeted photonic device. According to one embodiment, for a Vertical Cavity Surface-Emitting Laser (VCSEL") driver integrated circuit, two appropriately sized bipolar transistors with suitable controls are utilized to simulate the I-V characteristics of the VCSEL.

According to another embodiment for a receiver, a switchable resistor load is utilized to simulate bias conditions of a photo-detector. Because these simulated loading devices are subjected to the same semiconductor manufacturing process of the PMD IC, compatible consistency and resolution are expected under various testing conditions.

Figure 1:
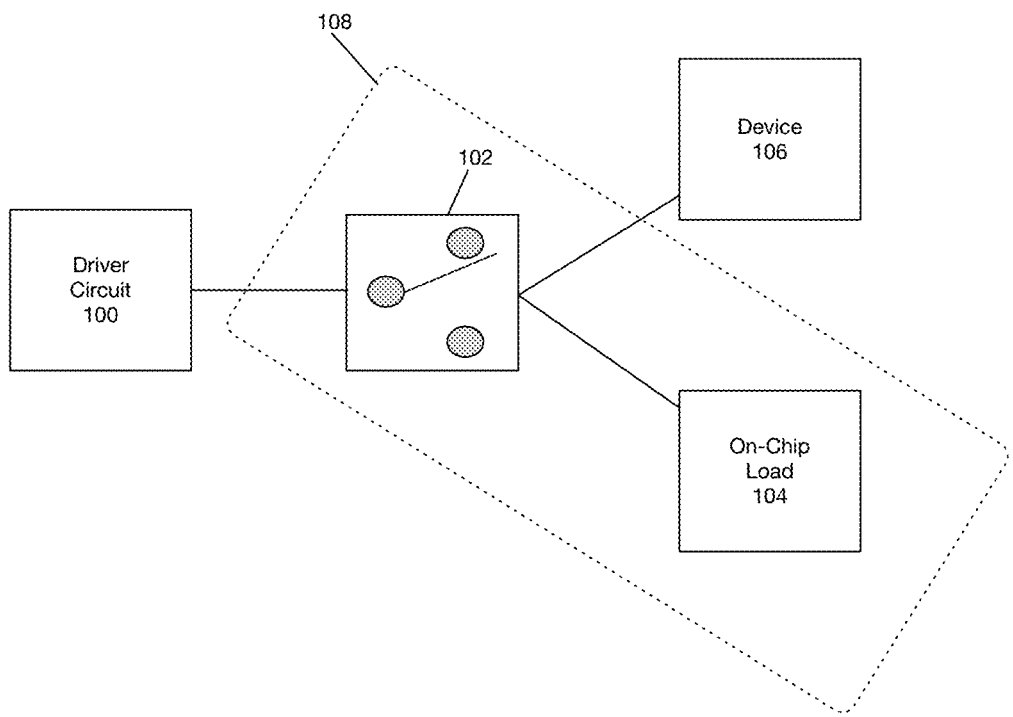
FIG. 1 is a block diagram of an on-chip built-in test and operational qualification system according to one embodiment.

FIG. 1 is a block diagram of an on-chip built-in test and operational qualification system according to one embodiment. On-chip built-in test and operational qualification module 108 may comprise switch 102 and on-chip load 104. According to one embodiment, switch 102 controls driver 100 driving either on-chip load 104 or device 106. Device 106 may be a photonic device acting as either a transmitter or a receiver. For example, according to one embodiment device 106 is a VCSEL. According to an alternate embodiment, device 106 is a photodiode.

According to one embodiment, on-chip load 104 may exhibit a particular I-V characteristic simulating that of device 106. According to one embodiment, on-chip load 104 may comprise any circuit comprising active and/or passive elements that exhibits an I-V characteristic similar or identical to load 106.

Figure 2A:
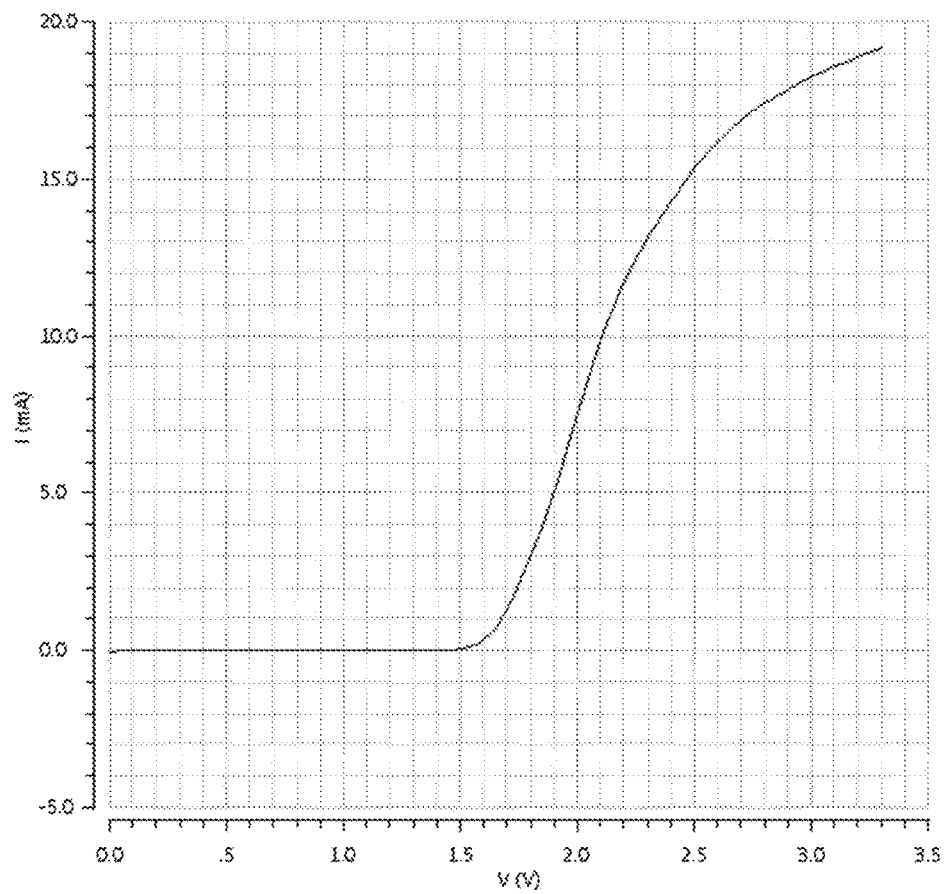
FIG. 2A is an exemplary I-V characteristic for a VCSEL device according to one embodiment.

FIG. 2A is an exemplary I-V characteristic for a VCSEL device according to one embodiment. As shown in FIG. 2A, the horizontal axis represents voltage (in volts) while the vertical axis represents current (in milliamps). In certain test and burn-in situations, it is desirable to model the I-V characteristic of a VCSEL device, such as the I-V characteristic shown in FIG. 2A, without requiring the presence of a VCSEL device itself.

Figure 2B:
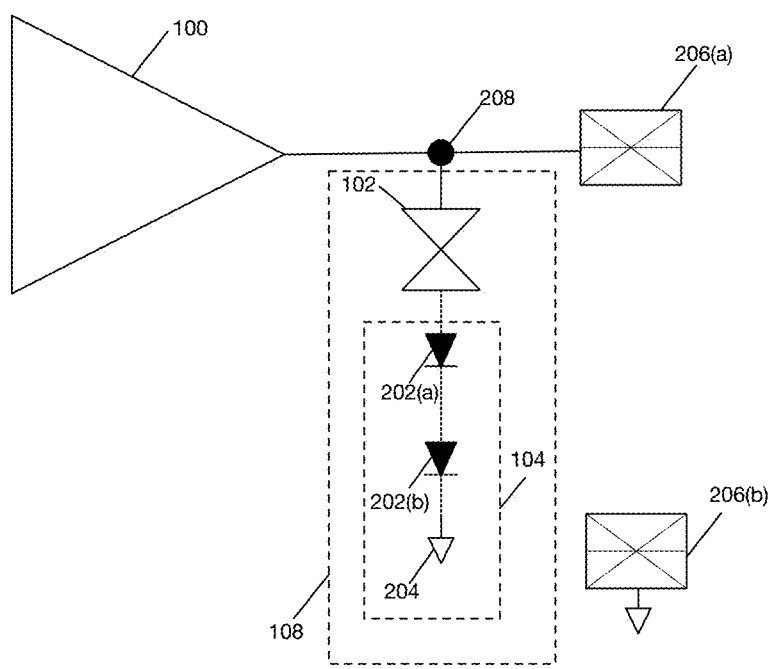
FIG. 2B is a schematic of an on-chip built-in test and operational qualification system for a laser device such as a VCSEL driver according to one embodiment.

FIG. 2B is a schematic of an on-chip built-in test and operational qualification system for a laser device such as a VCSEL driver according to one embodiment. On-chip built-in test and operational qualification module 108 may comprise switch 102 and on-chip load 104. On-chip load 104 is designed to exhibit a similar or identical I-V characteristic of a laser device such as a VCSEL (i.e., similar to that shown in FIG. 2A). According to one embodiment, on-chip load 104 comprises diode 202(*a*), diode 202(*b*) and ground 204.

Amplifier 100 provides a voltage or current signal that is received by either an actual VCSEL (not shown in FIG. 2B) or on-chip load 104. Switch 102 allows selection of either on-chip load 104 or actual VCSEL (not shown in FIG. 2B). Pads 206(*a*) and 206(B) provide for interconnection with other components or equipment (not shown in FIG. 2B).

Figure 3:
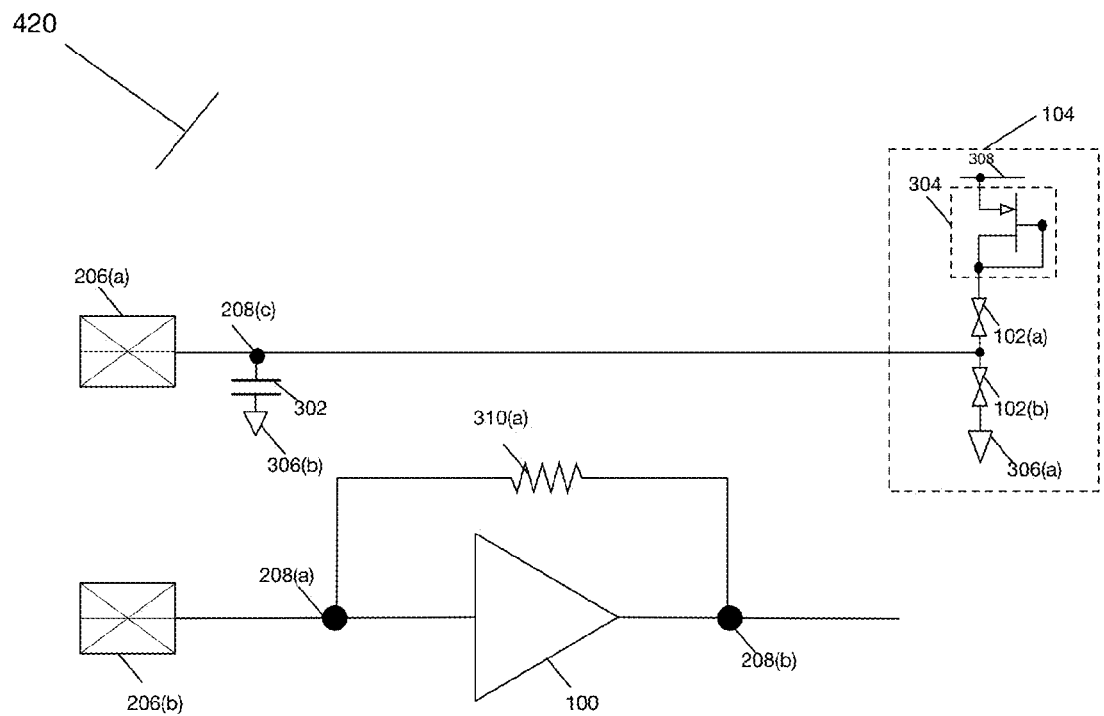
FIG. 3 is a schematic of an on-chip built-in test and operational qualification system for an optical receiver device according to one embodiment.

FIG. 3 is a schematic of a single channel on-chip built-in test and operational qualification system for an optical receiver device according to one embodiment. As described in detail below, channel 420 may be utilized as a component in a topological configuration for three modes of operation including normal operation, burn-in or high-speed test. Although the system and method described herein may be utilized for test and burn-in of a generic device, the topology depicted in FIG. 3 relates in particular to test and burn-in of a photodiode used in an optoelectronic receiver device.

Referring to FIG. 3, channel 420 of a single-channel module according to an embodiment comprises pad 206(*a*), pad 206(*b*), amplifier 100, resistor 310*a*, capacitor 302, ground 306(*b*) and on-chip load 104. Pad 206(*b*) is coupled to amplifier 100, which may be a transimpedance amplifier configured in a feedback configuration via resistor 310(*a*) coupling nodes 208(*a*) and 208(*b*). Pad 206(*a*) is coupled to on-chip load 104 and capacitor 302, which itself is coupled to ground 306(*b*). On-chip load 104 comprises power supply 308 (Vcc), current mirror 304, switch 102(*a*), switch 102(*b*) and earth ground 306(*a*). Node 208(*c*) functions as AC ground via capacitor 302 and ground 306(*b*).

According to one embodiment, in normal operation a reverse biased photodiode (not shown in FIG. 3) is coupled between pads 206(*a*) and 206(*b*). In particular, in this configuration the anode of the photodiode is attached to pad 206(*b*), while the cathode of the photodiode is attached to pad 206(*a*). During normal operation, the cathode requires a path to supply voltage 308 and therefore switch 102(*a*) is turned on and switch 102(*b*) is turned off. Current mirror 304 provides isolation and current limiting for supply 308.

During high-speed electrical test, switch 102(*a*) is turned off and switch 102(*b*) is turned on causing coupling of node 208(*c*) to earth ground 306(*a*) at low frequency to facilitate high-speed signaling.

Figure 4A:
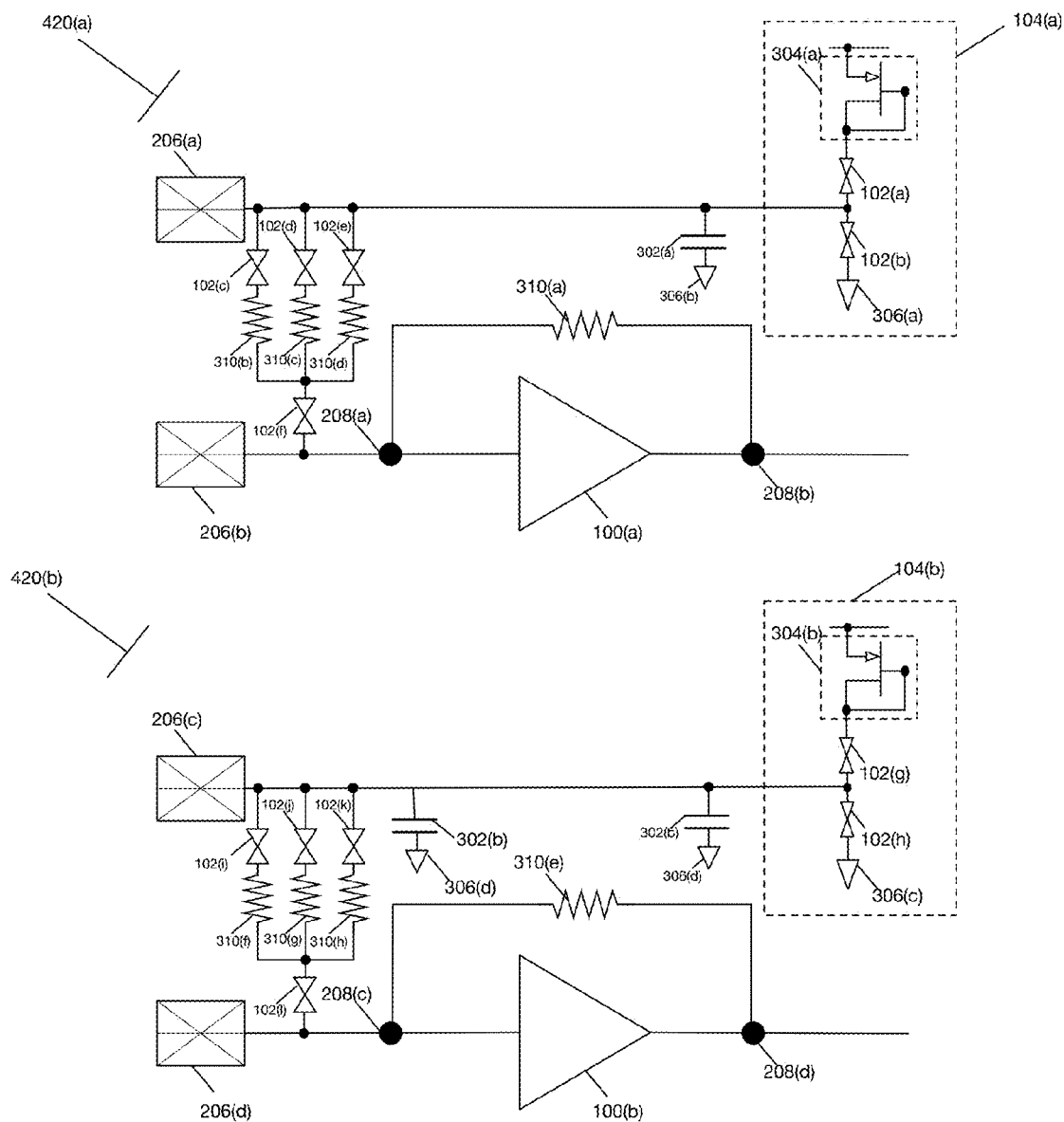
FIG. 4A is a schematic of a dual channel on-chip built-in test and operational qualification system for an optical receiver device according to one embodiment.

FIG. 4A is a schematic of a dual channel on-chip built-in test and operational qualification system for an optical receiver device according to one embodiment. On-chip built-in test and operational qualification system comprises channels 420(*a*) and 420(*b*) of a dual channel module 108. Each channel 420(*a*) and 420(*b*) is similar to that depicted in FIG. 3. However, a switched resistor network is added to each channel.

For example, as shown in FIG. 4A, first channel 420(*a*) associated with nodes 206(*a*) and 206(*b*) further comprises a switched resistor network comprising switched resistors (102(*c*), 310(*b*)), (102(*d*), 310(*c*)), (102(*e*), 310(*d*)) and switch 102(*f*) is coupled between pad 206(*a*) and pad 206(*b*) as shown. Similarly, second channel 420(*b*) associated with pads 206(*c*) and 206(*d*) further comprises a switched resistor network comprising switched resistors (102(*i*), 310(*f*)), (102(*j*), 310(*g*)), (102(*k*), 310(*h*)) and switch 102(*l*) is coupled between pad 206(*c*) and pad 206(*d*) as shown.

The switched resistor networks for each channel allow for introduction of various values of resistance between associated pads (i.e., pads 206(*a*) and 206(*b*) or between pads 206(*c*) and 206(*d*)). Thus, turning on or off various switched resistors in the networks controls the amount of current flow between the associated pads, which simulates the quiescent photocurrent of a photodiode. This allows a realistic burn-in condition to exercise the detector biasing and input current to amplifier 100, which may be, for example, a receiver amplifier.

Figure 4B:
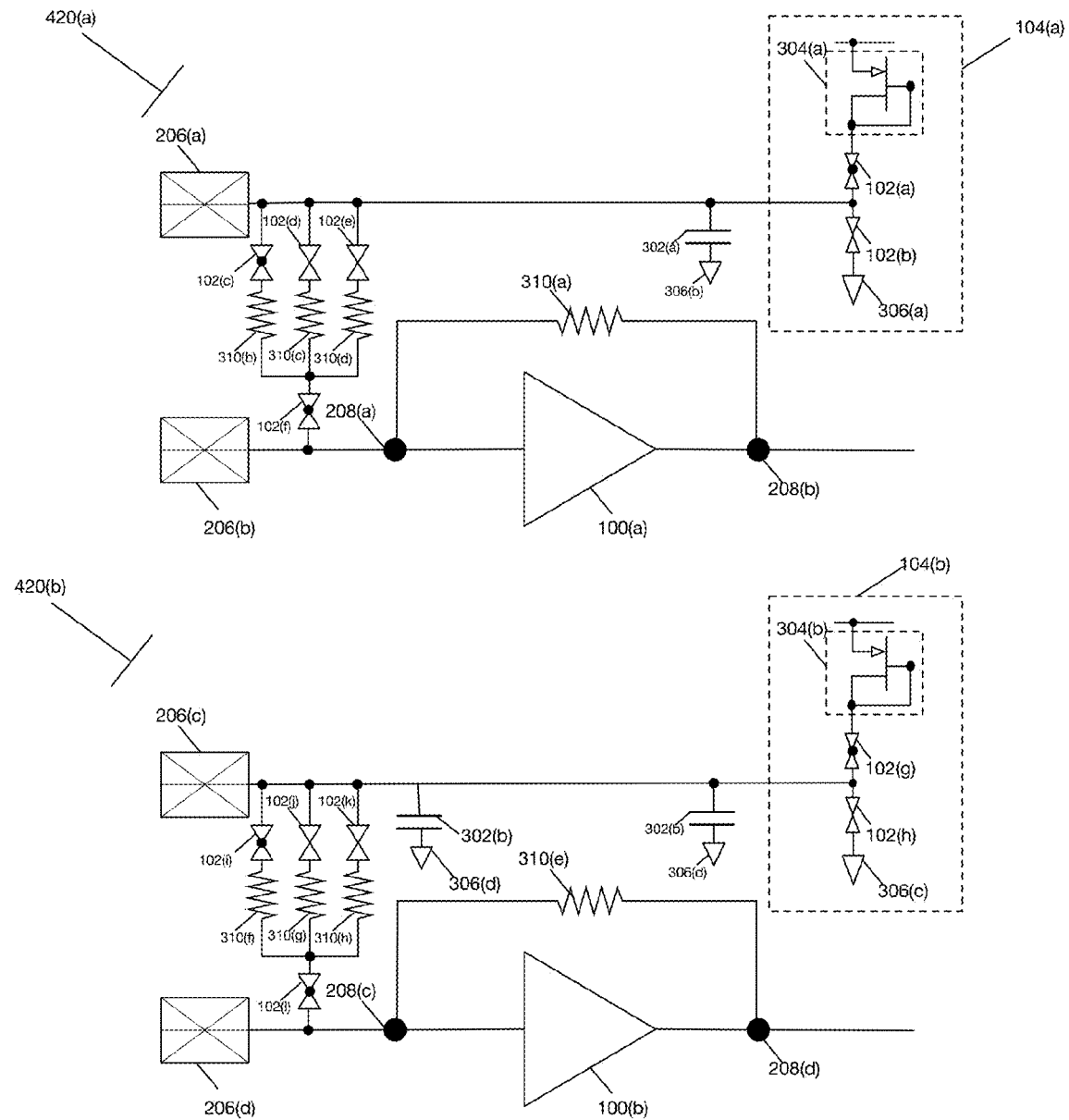
FIG. 4B is a schematic of a dual channel on-chip built-in test and operational qualification system for an optical receiver device configured for a burn-in operation according to one embodiment.

FIG. 4B is a schematic of a dual channel on-chip built-in test and operational qualification system for an optical receiver device configured for a burn-in operation according to one embodiment. As shown in FIG. 4B, switches 102(*a*), 102(*c*), 102(*f*), 102(*g*), 102(*i*) and 102(*l*) are turned on (as indicated by the black dot in the switch). All other switches are turned off.

Figure 4C:
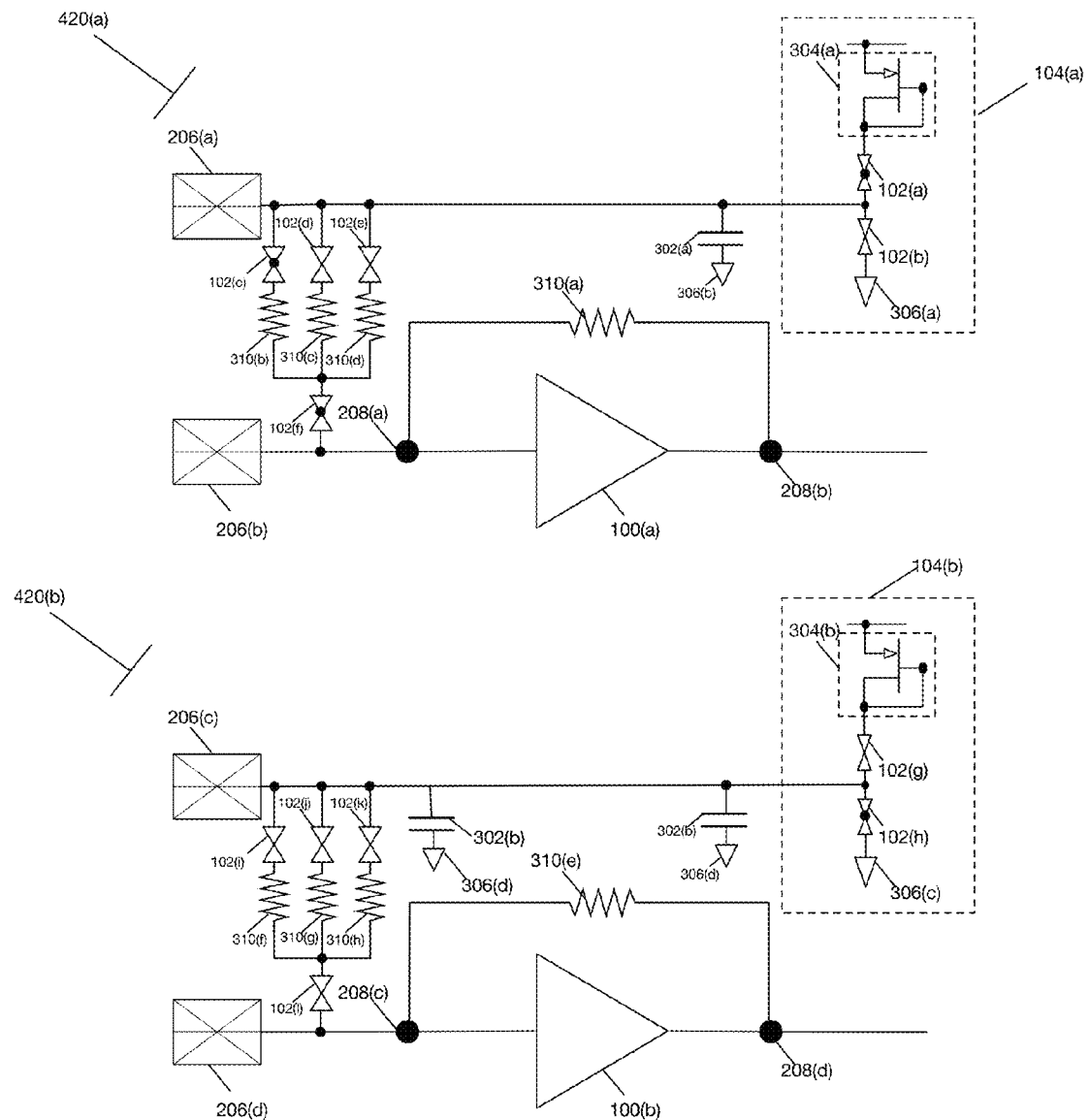
FIG. 4C is a schematic of a dual channel on-chip built-in test and operational qualification system for an optical receiver device configured for a high-speed test operation according to one embodiment.

FIG. 4C is a schematic of a dual channel on-chip built-in test and operational qualification system for an optical receiver device configured for a high-speed test operation according to one embodiment. As shown in FIG. 4C, switches 102(*a*), 102(*c*), 102(*f*), and 102(*h*) are turned on (as indicated by the black dot in the switch). All other switches are turned off. In this configuration, the switched resistor (102(*c*), 310(*b*)) along with switch 102(*f*) between pads 206(*a*) and 206(*b*) provide an appropriate quiescent (DC) current to simulate a photodiode. Pad 206(*c*) is grounded via switch 102(*h*) thereby providing a low impedance ground for the high-speed signal on pad 206(*b*).

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A system comprising:
   an amplifier configured to generate a signal for or receive a signal from a device, wherein the device is associated with a current characteristic and a voltage characteristic ("I-V characteristic"), wherein the device is a vertical-cavity surface-emitting laser ("VCSEL");
   a load circuit designed to exhibit the I-V characteristic of the device; and
   a switch coupled between the amplifier and the load circuit, such that the switch allows selection of one of either the amplifier coupled to the device or the load circuit, wherein the switch may be activated during operational qualification of the amplifier, and wherein the load circuit comprises a first diode coupled in series with a second diode between the switch and ground.

2. A system, comprising:
   an amplifier configured to generate a signal for or receive a signal from a device, wherein the device is associated with a current characteristic and a voltage characteristic ("I-V characteristic"), wherein the device is a photodiode;
   a load circuit designed to exhibit the I-V characteristic of the device, wherein the load circuit further comprises a current mirror, a first switch and a second switch coupled in series between a power supply and ground; and
   a switch coupled between the amplifier and the load circuit, such that the switch allows selection of one of either the amplifier coupled to the device or the load circuit, wherein the switch may be activated during operational qualification of the amplifier, wherein a node between the first and second switches is coupled to the switch.

3. The system according to claim 2, further comprising a first pad coupled to the load circuit, a second pad coupled to an input of the amplifier, and a switched resistive network coupled in series with the switch between the first pad and the second pad.

4. The system according to claim 3, wherein the switched resistive network further comprises at least one series combination of a switch and a resistor.

5. A system comprising:
a first channel and a second channel, wherein each channel further comprises:
  a first pad and a second pad;
  a switched resistor network coupling said first pad and said second pad, wherein the switched resistor network allows for selection of a desired resistance between the first pad and the second pad;
  an on-chip load coupled to the first pad, wherein the on-chip load comprises a current mirror, a first switch, a second switch and a ground node coupled in series between a power supply and ground, wherein a node between the first and second switches is coupled to the switched resistor network; and
an amplifier coupled to the second pad.

* * * * *